United States Patent [19]
Hosoe et al.

[11] 3,984,677
[45] Oct. 5, 1976

[54] PHOTO-ELECTRIC CONVERSION ELEMENT AND A METHOD FOR DETECTING OBJECT IMAGE VISIBILITY EMPLOYING THE SAME AND ALSO A DEVICE THEREFOR

[75] Inventors: Kazuya Hosoe; Hiroshi Aizawa, both of Machida; Seiichi Matsumoto, Yokohama; Hideo Yokota, Tokyo, all of Japan

[73] Assignee: Canon Kabushiki Kaisha, Tokyo, Japan

[22] Filed: Oct. 23, 1974

[21] Appl. No.: 517,295

[30] Foreign Application Priority Data
Oct. 29, 1973 Japan............................ 48-121551

[52] U.S. Cl. ........................ 250/214 P; 250/204; 250/209
[51] Int. Cl.² ........................................ H01J 39/12
[58] Field of Search ............... 250/204, 214 P, 202, 250/209, 293, 201; 354/162, 163

[56] References Cited
UNITED STATES PATENTS

| | | |
|---|---|---|
| 3,444,384 | 5/1969 | Horeczky............................ 250/204 |
| 3,700,905 | 10/1972 | Parkin et al..................... 250/203 R |
| 3,836,772 | 9/1974 | Stauffer ............................. 250/209 |
| 3,838,275 | 9/1974 | Stauffer ............................. 250/209 |

*Primary Examiner*—David C. Nelms
*Attorney, Agent, or Firm*—Toren, McGeady and Stanger

[57] ABSTRACT

The present invention relates to a photo-electric conversion element suitable for use in a system for detecting object image visibility and a method for detecting object image visibility employing the same and also relates to a device therefor. The photo-electric conversion element is characterized by having a first electrode at both ends of the direction along with a short side of a photo-semiconductor which has an extremely shorter short side as compared to its long side, and having a second electrode discretely formed at both ends of the direction along with its long side. Further an element with electrical characteristics being non-linear is connected to or formed at each of the above mentioned electrodes.

8 Claims, 12 Drawing Figures

FIG.10 ic # PHOTO-ELECTRIC CONVERSION ELEMENT AND A METHOD FOR DETECTING OBJECT IMAGE VISIBILITY EMPLOYING THE SAME AND ALSO A DEVICE THEREFOR

BACKGROUND OF THE INVENTION

1. Field of the Invention

The present invention relates to a photo-electric conversion element for a focus adjustment of an optical system especially suitable for such an optical instrument as a camera, etc., and to a method for detecting object image visibility and a device therefor.

2. Description of the Prior Art

Conventionally, as a method to detect object image visibility suitable for conducting focus adjusting of such optical instrument as a camera, etc., and a device therefor, for example, Japanese Patent Publication 39-29120, Japanese Patent Publication 41-14500 proposed by the applicant of the present application and U.S. Pat. No. 3,562,785 proposed by Dwin Richardson Craig (corresponding to West German Application DAS 1173327 specification, and corresponding to Japanese Patent Publication 44-9501, proposed by Dwin Richardson Craig, etc. are known.

Japanese Patent Publication 39-29120 discloses a device which utilizes the non-linear variation characteristics of such intensity of illumination versus resistance value as being peculiar to photo-conductive substances such as CdS, etc., and detects the focal point of an optical system by learning the variation state of the resistance value when an object image is formed by the optical system on the above mentioned photo-conductive substance.

Also Japanese Patent Publication 41-14500 constitutes an improvement of said Japanese Patent Publication 39-29120 and proposes a device being so composed that two photo-electric conversion elements having the above mentioned photo-conductive substance such as CdS, etc. are placed at such position as being in front and in the rear of a proposed focal plane of an optical system sandwiching the same therebetween and a focal point of the optical system is detected by detecting the differential output of both elements derived from the focus adjusting state of the optical system as the both elements are connected to a differential circuit.

Also the U.S. Pat. No. 3,562,785 discloses a method, in which the principle of the Japanese Patent Publication 39-29120 is basically employed and an object image is projected by an optical system on an image receiving planes of the two photo-electric conversion elements having non-linear variation characteristics of intensity of illumination versus resistance value as one of the elements receives clear image and the other one of the elements receives a diffused image. Accordingly, the variation in the resistance value of the elements generated as a result of variation in light distribution on image receiving planes of the elements caused by the variation in the visibility of an image is detected for adjusting the optical system until the electric response signal by both elements reaches the maximum value. A device is also disclosed to automatically adjust the optical system using the electric response signal by the both elements.

The photo-electric effect of the non-linear resistance — intensity of illumination characteristics of photo-electric conversion element mentioned above, means such phenomenon that the electrical properties, particularly the resistance value of a photo-electric conversion element, increases or decreases as the visibility the of object image formed on the photo-electric conversion element enhances. This phenomenon is based on the fact that as an amount of incident light per unit area of photo-conductive substance varies along with the variation in the visibility of object image when and the visibility becomes the maximum, there will be distinct deflection in the distribution of amount of incident light into each point of photo-conductive substance.

In other words, it is derived from a fact that the difference in the amount of light becomes maximum between the bright part and dark part of object image when the visibility is maximum, generating great difference in the resistance value of each part of the photo-conductive substance. However, in an object which actually exists and is photographed in practice, the distribution of a bright spot and a dark spot is quite irregular and the difference in brightness of the bright spot and the dark spot, that is contrast, is not necessarily high. Therefore sufficient photo-electric effect can not be obtained only by forming an object image on a photo-electric element plane having a certain area employing the above mentioned photo-conductive substance. Thus, the detection with a high degree of accuracy of object image visibility is regarded to be difficult.

SUMMARY OF THE INVENTION

The first object of the present invention is to provide a photo-electric conversion element which can secure selectively such two characteristics as are different from each other with, one semi-conductor having a photo-electric effect of non-linear resistance — intensity of illumination characteristics.

The second object of the present invention is to provide a method and a device for detecting object image which employs such photo-electric conversion element as being able to selectively obtain such two characteristics as are different from each other with one semi-conductor having photo-electric effect of non-linear resistance — intensity of illumination characteristics so that the visibility of an object image can be detected with high degree of accuracy.

The third object of the present invention is to provide a method and a device for detecting the visibility of object image which can automatically adjust focus accurately against any pattern of an object.

The fourth object of the present invention is to provide a method and a device for detecting an object image being suitable for focus adjusting of such optical instrument such as a camera, etc.

The fifth object of the present invention is to provide a camera which can automatically conduct focus adjusting, detecting the visibility of an object image.

Other objects of the present invention will become apparent from the specification and the drawings which will be explained in detail hereinunder.

BRIEF DESCRIPTION OF THE DRAWINGS

FIG. 1 shows schematic diagrams to show theoretical structure of such a photo-electric conversion element as being suitable for use in the present invention.

DESCRIPTION OF THE PREFERRED EMBODIMENTS

Now, some examples of a photo-electric conversion element and a method and a device to detect object image visibility employing said element will be explained by referring to the drawings.

Figures 1A, 1B, 2, 3A:
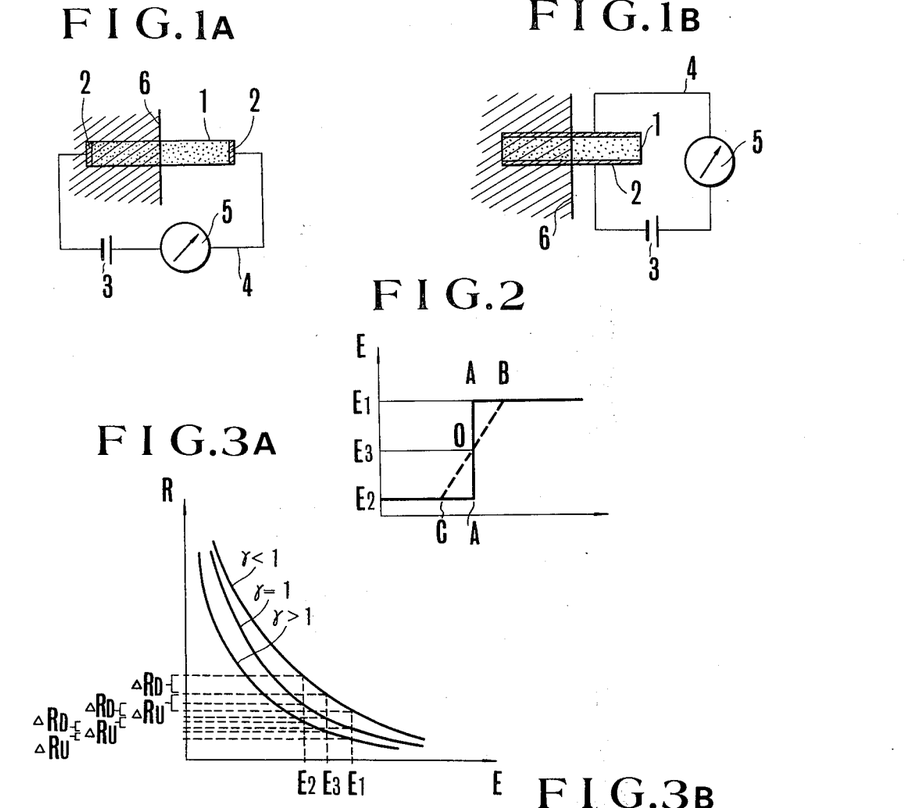
FIG. 2 is a line diagram to show the outline of the distribution of illumination intensity of the object light on a photo-electric conversion element.

FIG. 1A, FIG. 1B are schematic diagrams to show theoretical structure of a photo-electric conversion element suitable for use in the present invention. FIG. 1A shows a manner in which a photo-electric conversion element, (hereinafter this is called as a series type element) consisting of an electrode 2 at a short side of a semi-conductor 1 formed in a such manner that the short side is extremely shorter than its long side, is connected to a power source 3 through a lead wire 4. FIG. 1B shows a manner in which a photo-electric conversion element, (hereinafter this is called as a parallel type element) consisting of the electrode 2 at the long side of the semi-conductor 1 of similar shape as FIG. 1B, is connected to the power source 3 through the lead wire 4. In FIG. 1A, FIG. 1B, 5 shows an ammeter for measuring photo-electric current and 6 shows a boundary line between bright and dark of an object image formed by an imaging optical system not shown in the drawing on each of the above mentioned photo-electric conversion elements.

As mentioned above, when a short side of a photo-semiconductor is so formed as being extremely shorter than the long side thereof, the boundary line 6 between bright and dark of an object image laid on the photo-semiconductor is deemed to have extremely high frequency to become such as shown in the drawing. In other words, in the series type element (FIG. 1A), the boundary line 6 between bright and dark and the direction of photo-current are deemed to form almost right angles and in the parallel type element (FIG. 1B) they form almost parallel lines.

As shown in FIG. 1A and FIG. 1B in such two kinds of photo-electric conversion elements as having distinctly different structures, the relationship of the variation of the electric properties of the elements particularly the resistance value or photo-current, being caused by the variation in object image visibility will be explained below.

FIG. 2 is a line diagram to show the outline of the distribution of illumination intensity of object light on a photo-electric conversion element, wherein the ordinate shows the intensity of illumination while the abscissa shows the distribution zone on the photo-electric conversion element, and the solid line in the drawing shows the distribution state of intensity of illumination when the visibility of object image is the maximum, and the broken line indicates the distribution state of intensity of illumination when the visibility is lowered.

Generally speaking, the electric properties of a photo-semiconductor, particularly the relationship between the resistance value R and the intensity of illumination E, are known to satisfy the following equation:

$$R = KE^{-\gamma} \qquad 1.$$

In the above, $K$, $\gamma$ are values incidental to a photo-semiconductor in question.

Therefore when a prescribed voltage is impressed on said photo-semiconductor and the is expressed by I, it is apparent that the following equation is satisfied:

$$I = K'E^{\gamma} \qquad 2.$$

wherein $K'$ is a constant determined by the properties incidental to a photo-semiconductor and by the voltage impressed.

Figure 3B:
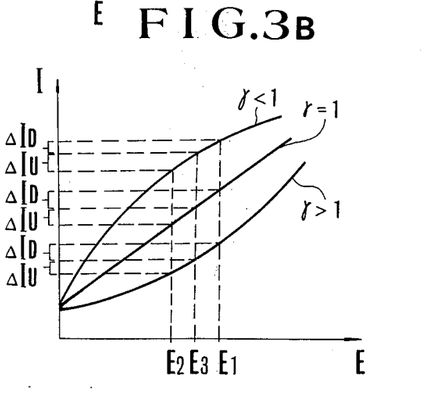
FIG. 3 shows a line diagram to show the relationship between resistance value R and intensity of illumination E, and that between photo-current I and intensity of illumination E in the case of $\gamma>1$, $\gamma = 1$ and $\gamma<1$.

FIG. 3A and FIG. 3B are to show the relationship between R and E also I and E, respectively, especially in the cases of $\gamma>1$, $\gamma = 1$, and $\gamma<1$.

First, the characteristics of the series type element shown in FIG. 1A will be reviewed. Now, it is supposed that the distribution of the intensity of illumination near the boundary line 6 between bright and dark on the light receiving plane of said element changes ae shown generally in FIG. 2 from solid line A—A to broken line B—C. That is, the intensity of illumination of AB part near the right hand side of the point A lowers, while the intensity of illumination at AC part near the left hand side of the point A goes up. The intensity of illumination $E_3$ may be considered to be the mean value between $E_1$ and $E_2$. In FIG. 3A, the relationship between these variations in the intensity of illumination and local variation in the resistance value is reviewed. When the length of AB part and of AC part is extremely small, the above mentioned lowering of intensity of illumination may be considered to almost correspond to the variation of intensity of illumination from $E_1$ to $E_3$, while the going up of the intensity of illumination may be considered to correspond to the variation in the intensity of illumination from $E_2$ to $E_3$. Therefore, as shown in FIG. 3A, the increase of resistance value accompanying to said variation in the intensity of illumination will be $\Delta R_U$ in the case of $\gamma<1$, while the lowering of resistance value will be $\Delta R_D$. On the other hand, when the formula (1) is differentiated twice, the following equation is obtained:

$$\frac{d^2R}{dE^2} = K\gamma(\gamma + 1)E^{-(\gamma + 2)} > 0$$

From the above, apparently the relationship of $\Delta R_D > \Delta R_U$ is obtained. Therefore, the algebraic sum of the resistance value variation by local variation of the intensity of illumination becomes negative and finally the overall resistance value of the photo-semiconductor 1 decreases and photo-current increases. This apparently will be true in the case of $\gamma = 1, \gamma > 1$. In other words, it is learned that in the case of series type element, the resistance value becomes the maximum (photo-current value becomes the minimum) when the visibility of object image is the maximum, not depending on the value of $\gamma$.

Next, similar review will be made on the characteristics of the parallel type element of FIG. 1B. But, in this case, to facilitate the review, the relationship between I and E is considered. When the decrease in photo-current accompanying to the decrease in the intensity of illumination at AB part is expressed as $\Delta I_D$, while the increase of photo-current accompanying to the increase of the intensity of illumination at AC part is expressed by $\Delta I_U$, the following equation is derived from the formula (2):

$$\frac{d^2I}{dE^2} = K'\gamma(\gamma - 1)E^{\gamma - 2}$$

and as the following formula can be obtained corresponding to $\gamma < 1, \gamma = 1, \gamma > 1$:

$$\frac{d^2I}{dE^2} < 0, \quad \frac{d^2I}{dE^2} = 0, \quad \frac{d^2I}{dE^2} > 0,$$

respectively, in the case of $\gamma < 1$, $\Delta I_U > \Delta I_D$ is obtained, and in the case of $\gamma = 1$, $\Delta I_U = \Delta I_D$ is obtained, while in the case of $\gamma > 1$, $\Delta I_U < \Delta I_D$ is obtained. Therefore, in the case of $\gamma < 1$, the photo-current flowing overall photo-semiconductor 1 becomes minimum (the resistance value becomes maximum) when the visibility of object image is the maximum, and in the case of $\gamma = 1$, the photo-current will be constant (the resistance value is constant) irrespective of the local variation in the visibility of object image, while in the case of $\gamma > 1$, the photo-current becomes maximum (the resistance value becomes minimum) when the visibility of object image is maximum.

As a result of above reviews, it becomes apparent that while the series type element and such parallel type element as $\gamma > 1$ both have non-linear photo-electric effect of a photo-semiconductor, their electric properties, particularly the manner of variation in their resistance value accompanying to the variation in the object image visibility will be reverse to each other. Therefore, for example, when the same object image is formed on both a series type element and a parallel type element being composed of such semiconductor as $\gamma > 1$, as the visibility on each element of said object image enhances, the resistance value increases in a series type element while the resistance value decreases in the parallel type element. Therefore, the difference in the resistance value of both photo-electric conversion elements becomes remarkably large and the detection ability is largely enhanced compared to the case of visibility detection of object image using one type element only.

The present invention is to conduct sharp detection of object image visibility by multiplying the detection effect based on the characteristics of a series type element and a parallel type element having such characteristics as reverse to each other which are jointly used.

Figure 4:
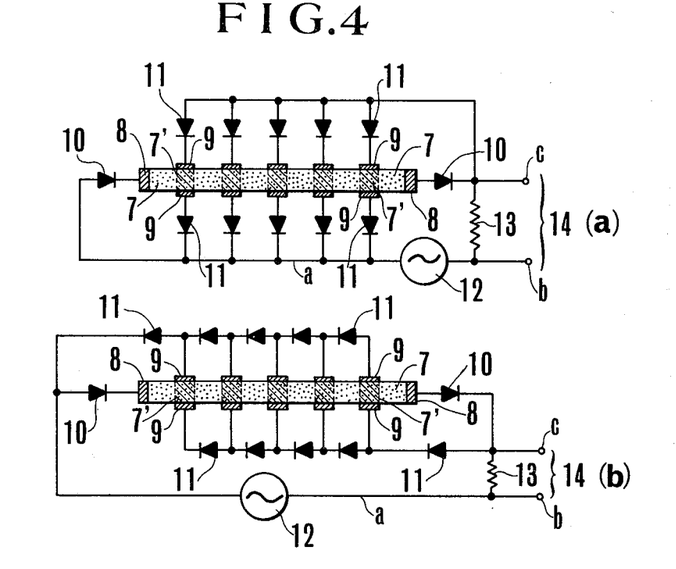
FIG. 4 is a schematic diagram to show an example of form in which alternating current power source and load resistance are connected to a photo-electric conversion element according to the present invention.
Figure 7:
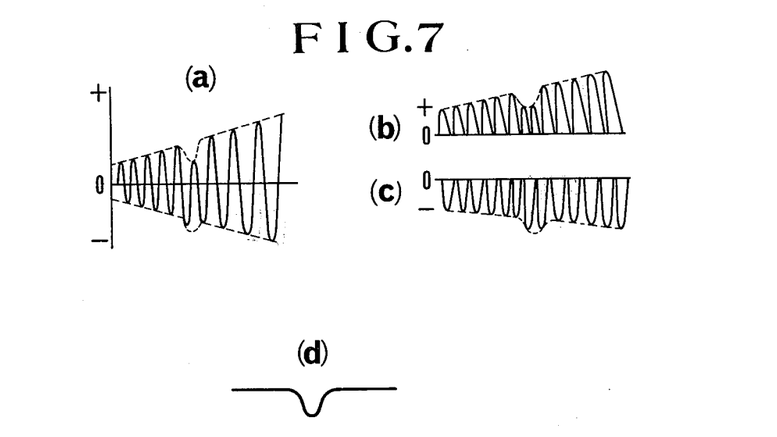
FIG. 7 is a wave form diagram of output at each point of the object image visibility detection circuit shown in FIG. 5 and FIG. 6.

FIG. 4 shows an example of manner in which an alternating current power source and a load resistance are connected to the photo-electric conversion element according to the present invention. In FIG. 4(a), 7 is a photo-semiconductor with such shape as having an extremely short side as compared to its long side, and two diodes 10 and many numbers of diodes 11 are connected to a first electrode 8 at both ends in a direction along the short side of said photo-semiconductor and to numbers of second electrodes 9 formed discretely at both ends in a direction along the long side of said photo-semiconductor, and as shown in the drawing, an alternating current power source 12 with suitable frequency and a load resistance 13 are connected. The function of such photo-electric conversion element according to the present invention as having said structure will be as follows. Now, when the point "a" at both ends of alternating current power source has positive electric potential against the point "b", current flows along the long side of the photo-semiconductor 7 through the diode 10 and flows through the other diode 10, the load resistance 13. Therefore at an output terminal 14 the point "c" takes positive electric potential against the point "b". Contrary to this, when the point "b" has positive electric potential against the point "a", current flows through the load resistance 13, the diode 11, the short side of the photo-semiconductor 7 and the diodes 11, and the point "b" takes positive electric potential against the point "c" at the output terminal 14. Further it is apparent that the size of current flowing in each case that is the output voltage at the output terminal 14 is determined depending on the electric properties of the photo-semiconductor, especially to the resistance value thereof. Also it does not need explanations that when the point "a" takes positive electric potential against the point "b" at both ends of the alternating current power source 12, said photo-electric conversion element functions as a series type element, and contrary thereto, when the point "b" takes positive electric potential against the point "a," said photo-electric conversion element functions as a parallel type element. Therefore, as may be understood from what has been explained in FIG. 1 and FIG. 3, when the object image brightness on photo-semiconductor is varied and output is taken out from the output terminal 4, such wave form as shown in FIG. 7(a) is obtained. In this drawing, the electric potential at the point "b" is made as zero, the (+) side output is a series type element output while the (-) side output is a parallel type element output. Of course at the point where the object image visibility becomes the maximum (+) side output becomes the minimum and the absolute value of (-) side output becomes the maximum. The output amplitude increases by the effect of the image brightness accompanying to the shifting of an optical system forming an image on the photo-semiconductor 7. FIG. 4(b) is a drawing of an example of another circuit connection employing similar elements as in the example (a). While its function and effect are same as in the example of the drawing (a) and explanations thereof will be omitted, the function of series type element and of parallel type element appears alternatively accompanying to the variation in the polarity of alternating current power source 12 and the voltage wave form appearing at the output terminal 14 will be as shown in FIG. 7(a). The hatched part 7' shown by broken line in FIG.

4(a)(b) is a light absorbing filter consisting of an electrically insulating substance having appropriate transmissibility. It can be formed by evaporation, etc. on the semiconductor or by attaching a separate thin film. Since the function and effect of the above mentioned filter will be such that its resistance value will have a remarkable difference between the case when current flows in a direction along the long side of the photo-semiconductor (the case when it functions as a series type element) and the case when current flows in a direction along the short side of the photo-semiconductor (the case when functions as a parallel type element). Further by making the intensity of illumination at the hatched part 7' which functions as a parallel type element low, the resistance of the parallel type element is increased and it is intended to reduce the difference in the resistance value between the both elements. Also the photo-semiconductor part which functions as a series type element is the part except for the hatched part 7' as the current at that time bypasses the electrode 9. By the effect of this filter, the difference in the electrical properties not derived from the object image visibility between the above mentioned photo-electric conversion element as a series type element and that as a parallel type element is reduced so that the sensitivity in the visibility detection is remarkably enhanced.

Figure 5:
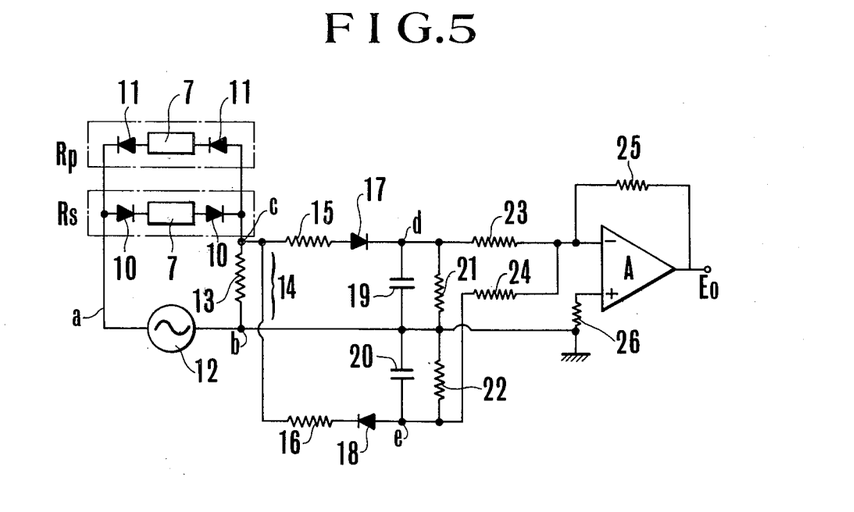
FIG. 5 is a drawing of an example of a detection circuit of object image visibility employing the photo-electric conversion element shown in FIG. 4 according to the present invention.
Figure 6:
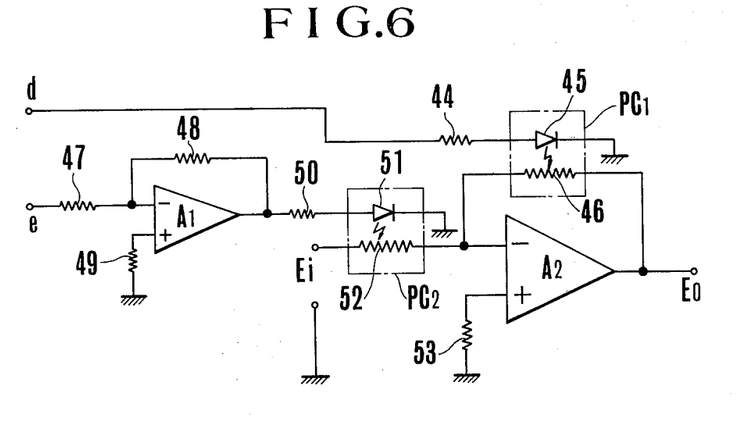
FIG. 6 is a drawing of second example of an object image visibility detection circuit employing a photo-electric conversion element shown in FIG. 4 according to the present invention.

FIG. 5 and FIG. 6 are drawings of examples of an object image visibility detection circuit employing the photo-electric conversion element according to the present invention, and in said drawings Rs and Rp shown by broken line are and electrically equivalent circuit in the case as functioned as a series type element and an electrically equivalent circuit of a parallel type element, respectively, and when the point "c" has positive electric potential at the output of the terminal 14, the output current flows through the input resistance 15, a diode 17, a smoothing condenser 19 and a discharge resistance 21 and is inputted into an amplifier A through an arithmetic resister 23, and when the point "c" has negative electric potential, being contrary to the above, the output current flows through a smoothing condenser 20, a discharge resister 22, a diode 18, and an input resister 16 and is inputted into the amplifier A through the smoothing condenser 20, the discharge resister 20 and an arithmetic resister 24. In said circuit, the output wave form at the points "d" and "e" will be as shown in FIGS. 7(b)(c). The amplifier A, the arithmetic resisters 23, 24, 25 and the resister 26 compose an addition amplifier as a whole, and the output signal wave form of FIGS. 7(b)(c) is smoothed by the smoothing circuit and what is obtained by adding both of the output signals together appears as the output Eo as such wave form as shown in FIG. 7(d). Therefore the output becomes the minimum at the point where the object image has the highest visibility. Thus, by detecting the minimum value of output Eo with a method to be shown later, it becomes possible to perform automatic focus adjusting function.

FIG. 6 shows another example of the object image visibility detection circuit according to the present invention. While the difference in outputs from the series types element Rs and the parallel type element Rp is detected for detecting the object image visibility in the Example of FIG. 5, the detection with higher degree of sensitivity of the object image visibility can be done in the Example of FIG. 6 by detecting the ratio of the same two outputs. In this drawing, the points shown as "d", "e" are to correspond to the points "d", "e", in FIG. 5(a), respectively, and the output of the series type element and that of the parallel type element according to the present invention are to be supplied thereto. The output of the series type element supplied to the point "d" excites a luminescent diode 45 constituting a photo-coupler $PC_1$, through a limiting resister 44. The luminous flux irradiated by the luminescent diode 45 varies the resistance value of a light receiving element 46 constituting the photo-coupler $PC_1$ in correspondence with the output of series type element.

$A_1$ is an arithmetic amplifier being connected with resisters 47, 48 and 49 to constitute a reversal amplifier. And while the output of parallel type element is supplied to the point "e," an output of different code is generated at an output terminal of said reversal amplifier by the action of said amplifier to excite a luminescent diode 51 constituting another photo-coupler $PC_2$ through a limiting resister 50, and the photo-output of the luminescent diode 51 varies the resistance value of a light receiving element 52. The resistance value of said light receiving element 52 at this time is naturally to correspond to the output of the parallel type element. From the above, such signals as corresponding to the outputs of the series type element and the parallel type element have been given to the light receiving elements 46 and 52, respectively. $A_2$ is an arithmetic amplification circuit having the light receiving element 45, with such output signal provided thereto, being connected to the feedback circuit thereof and having the light receiving element 52 to the input circuit of the same. 53 is a compensation circuit. In the circuit mentioned above as known well, its output Eo corresponds to the ratio of the resistance value between the resister (light receiving element) 46 and the resister (light receiving element) 52. Therefore, when the object image visibility of each element of the present invention becomes the maximum, the resistance value of the resister 46 becomes the maximum while that of the resister 52 becomes the minimum, thus the output Eo shows the maximum value. When such output Eo is used in combination with a suitable control circuit, the detection of the highest visibility point of an object image or automatic focus adjustment of a photographing optical system can be done.

Figures 8, 9:
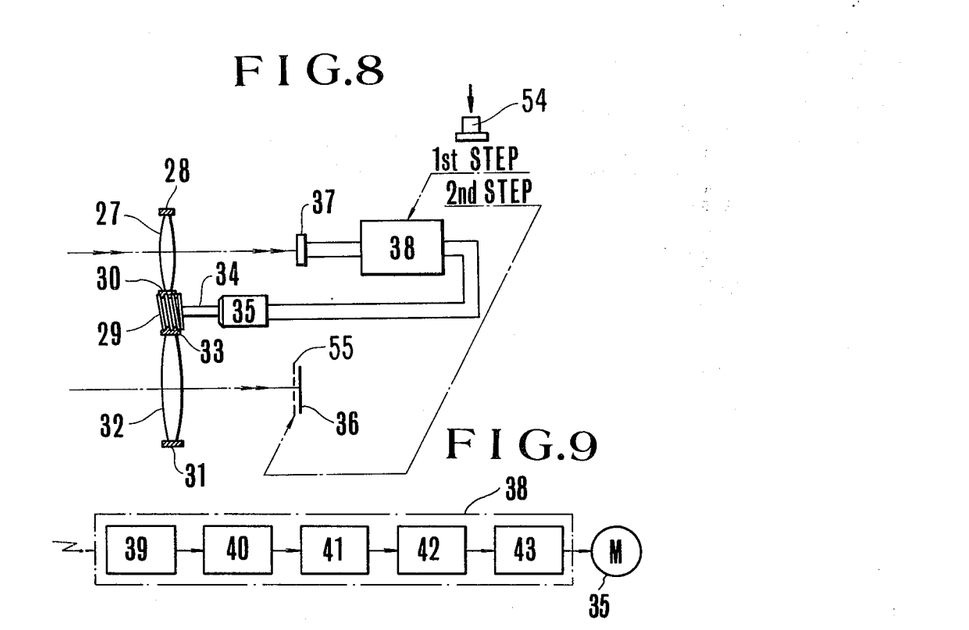
FIG. 8 is a schematic diagram to show a state in which the object image visibility detection device employing the photo-electric conversion element shown in FIG. 4 according to the present invention is applied to a camera.
FIG. 9 is a block diagram to show concrete component parts of a control circuit 38 of the system shown in FIG. 8.
Figure 10:
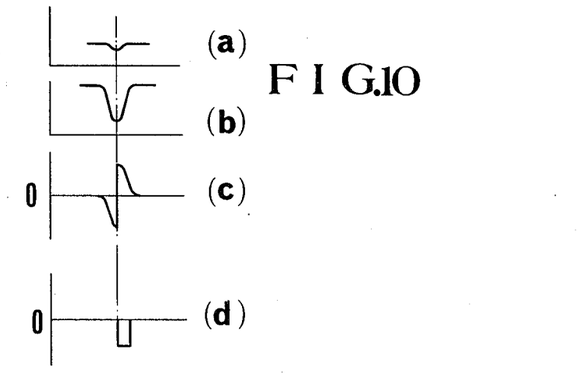
FIG. 10 is a drawing to show a chronological change in each output of each of the circuits, 39, 40, 41, 42, 43 of the control circuit 38 shown in FIG. 9.

FIG. 8 is a schematic drawing of an example of an automatic focus adjusting device employing the photo-electric conversion elements according to the present invention as shown in FIG. 4. In this drawing, 27 is a visibility detection optical system held by a bodytube 28. A rack 30 is fixed at a part of the bodytube 28 at its lower outer periphery, to engage with a wormgear and to move said optical system 27 to the front and to the rear. The wormgear 29 is so made as rotate by the rotation of a motor 35 through an axle 34, engaging with a rack 33 provided on upper outer periphery of a bodytube 31, so that a photographing optical system 32 held by said bodytube 31 is moved to the front and to the rear simultaneously with the visibility detection optical system 27. Thus, the visibility detection optical system 27 and the photographing optical system 32 make simultaneous forth and back movements from the above mentioned set-up by the normal and reverse rotation of the motor 35. A photo-electric conversion element 37 according to the present invention is provided within the optical path of the visibility detection optical system 27 in the rear of said system. The output of said photo-electric conversion element 37 is supplied to the control circuit 38, and such control output as corresponding to the visibility of an object image is supplied to the motor 35 within the control circuit 38 to move the visibility detection optical system 27 and the photographing optical system 32 to the front and to the rear and to stop the same, thus automatic focus adjustment is done by setting such position of both optical systems as automatically providing the maximum visibility of an object image. 36 is a film positioned at a focal plane of the photographing optical system, 55 is an opening and closing member of a shutter, being provided in front of said film F, and 54 is a release button of the camera, and these parts are shown in a general form. The function of this device will become apparent from the drawing of an example of a control circuit to be explained below.

FIG. 9 is to show important parts of concrete example of a case when the object image visibility detection device shown in FIG. 8 is fitted to a camera to make it as an automatic focus adjusting system. In the same drawing, 39 is a detection circuit employing, for example, the object image detection circuit shown in FIG. 5 and its output is to correspond to the object image visibility as mentioned above, showing the minimum value at the point where visibility is the maximum. Said output is then supplied to a direct current amplifier 40 and is amplified to such size that succeeding process will be easy. The output of said direct current amplifier 40 is inputted into a differential circuit 41 and such output as corresponding to the variation of the output of the direct current amplifier 40 is obtained. The output of the differential circuit 41 is then inputted into a comparator 42 and such sudden variation point of the differential output as giving the maximum visibility of object image is detected, generating pulse output. A switching circuit with known setup places the motor 35 in a short-circuited state by said pulse output to exercise such function as suddenly stopping the motor.

The function of the automatic focus adjusting device of the present invention shown in FIG. 8 and FIG. 9 will be explained below.

When a photographer points the device to an object to be photographed and presses down, for example, a release button 44 of 2 step action to its first step, the control circuit shown in FIG. 9 is placed in an operating state and the motor 35 is rotated to a prescribed direction to shift the photographing optical system 32 and the visibility detection optical system 27 from the nearest or infinity positions to a predetermined direction. The chronological change of the output of each block of the control circuit at this time is shown in FIGS. 10(a) to (d).

The output of the visibility detection circuit 39 varies as shown in (a). That is, it makes sudden raise and drop with the maximum visibility point of the object image as its center point. The output variation of the direct current amplifier 40 is as shown in (b) and this is only the output variation of (a) being amplified. (c) shows the output variation of a differentiation circuit 41, and the variation is made in such manner that the code is reversed in the front and in the rear of the maximum visibility point of the object image and passes zero potential within a very short period of time at the maximum visibility point. The comparator 42 has a reference potential for comparison at zero in this example and generates pulse at a moment the differentiation output passes zero potential. Its manner is shown in (d). The pulse shown in (d) is supplied to a switching circuit 43 to place the motor 35 in a short-circuited state momentarily to suddenly stop the same. From the above, a photographer notices by some means that the optical system is stopped to learn that the object image is visibly imaged, then as he presses the release button down to second step the opening and closing member 55 of shutter is controlled to give exposure to the film 36.

Examples of the above mentioned present invention are not limited to those set-ups mentioned above, instead it is also possible, for example, an ordinary diaphragm is provided in a visibility detection optical system so that the intensity of illumination at the plane of photo-electric element is almost constant irrespective of the object brightness for insuring the stable operation of the control circuit, and that when the above mentioned automatic focus adjusting operation is difficult as in the case when object brightness is very low, etc., the motor 35 is controlled, learning the output level of the direction current amplifier 40 to stop the photographing lens at an over-focus position. Further, the control circuit can naturally have other patterns having similar functions being easily worked out, not being limited to the example shown above.

As has been explained above the present invention has such function as automatically detecting focus in a precise manner against an object of any pattern by using a photo-electric conversion element which comprises the same photo-semiconductor and functions as a series type element and as a parallel type element alternatively as alternating current is provided thereto. Thus it is highly effective against any practical object which needs to be focussed actually and is ordinarily consisting of complicated pattern in most cases.

What is claimed is:

1. An object image visibility detection system, comprising:
   a. an image optical system for forming an object image at a prescribed position;
   b. a photo-electric conversion device having:
      1. a photo semiconductor in a band form having short and long sides, said short sides extremely shorter than said long sides, said photo semiconductor being arranged at a position almost conjugate to the above prescribed position and having a resistance value corresponding to the brightness of the object image formed on the image optical system;
      2. a first pair of electrode pieces having an input electrode piece and an output electrode piece with its input electrode piece being arranged on one side of the opposing short sides of the photo semiconductor, and its output electrode piece being arranged on the other short side; and
      3. a second pair of electrode pieces having an input electrode piece and an output electrode piece with its input electrode piece being arranged on one of the opposing long sides of the photo semiconductor and its output electrode being arranged on the other long side; and
   c. an object image visibility detection means having:
      1. current supplying means for supplying the current alternately to the input electrode piece of the first pair of electrode pieces and to the input electrode piece of the second pair of electrode pieces; and
      2. detecting means for detecting the output voltage from the output electrode piece of the first pair of electrode pieces and the output voltage from the output electrode piece of the second pair of electrode pieces to determine the maximum visibility of the object image.

2. A system according to claim 1, in which the detecting means has a comparator circuit to compare both of the voltage values being developed at the output electrodes of said first and second pair of electrode pieces.

3. A system according to claim 1, in which the said detecting means has an additional amplification circuit to amplify both of the voltage values being developed at the output electrodes of the first and second pair of electrode pieces.

4. A system according to claim 1, in which the said detecting means includes an arithmetic circuit.

5. A system according to claim 1, in which the said second pair of electrode pieces, which are positioned in a direction along the sides of said photo semiconductor, are provided at least two in number, and each of said pair of electrode pieces being electrically connected in parallel with each other and being positioned at discrete points along the photo-semiconductor.

6. A system according to claim 5, in which a light absorbing filter composed of an electrically insulating substance is arranged between the opposing electrode pieces of the second pair of electrode pieces so as to cover the photo semiconductor.

7. A system according to claim 1, in which means for preventing reverse flow of the current is arranged between the first pair of electrode pieces and the current supplying means and between the second pair of electrode pieces and the current supplying means so as to make the current flow in one direction.

8. A system according to claim 7, in which the above mentioned current reversal prevention means has at least one diode.

* * * * *

UNITED STATES PATENT OFFICE
CERTIFICATE OF CORRECTION

Patent No. 3,984,677    Dated October 5, 1976

Inventor(s) Kazuya Hosoe et al

It is certified that error appears in the above-identified patent and that said Letters Patent are hereby corrected as shown below:

In the heading of the Patent [30] should read as follows:

--[30]  Foreign Application Priority Data

Oct. 29, 1973  Japan.........48-121351--.

Signed and Sealed this

Thirtieth Day of November 1976

[SEAL]

Attest:

RUTH C. MASON
Attesting Officer

C. MARSHALL DANN
Commissioner of Patents and Trademarks